United States Patent [19]

Batey et al.

[11] Patent Number: 4,987,095
[45] Date of Patent: Jan. 22, 1991

[54] METHOD OF MAKING UNPINNED OXIDE-COMPOUND SEMICONDUCTOR STRUCTURES

[75] Inventors: John Batey, Danbury, Conn.; Sandip Tiwari, Ossining; Steven L. Wright, Peekskill, both of N.Y.

[73] Assignee: International Business Machines Corp., Armonk, N.Y.

[21] Appl. No.: 207,700

[22] Filed: Jun. 15, 1988

[51] Int. Cl.$^5$ .......................................... H01L 29/78
[52] U.S. Cl. ................................ 437/106; 437/107; 437/132; 437/184; 437/185; 437/40; 437/41; 437/42; 437/913; 437/983; 437/941; 437/978; 437/980; 148/33.3; 148/33.4; 148/DIG. 149; 357/23.15; 357/54
[58] Field of Search ............... 437/184, 980, 913, 983, 437/190, 191, 195, 34, 941, 978; 148/33.3, 33.4, DIG. 149; 357/23.15, 54

[56] References Cited

U.S. PATENT DOCUMENTS

| | | | |
|---|---|---|---|
| 4,144,634 | 3/1979 | Chang et al. | 437/184 |
| 4,297,176 | 8/1981 | Hannah et al. | 437/184 |
| 4,556,895 | 12/1985 | Ohata . | |
| 4,615,766 | 10/1986 | Jackson et al. . | |
| 4,634,474 | 1/1987 | Camlibel et al. | 437/980 |
| 4,645,564 | 2/1987 | Morie et al. | 437/980 |
| 4,757,030 | 7/1988 | Galvin et al. | 437/184 |
| 4,843,450 | 6/1989 | Kirchner et al. | 357/23.15 |
| 4,859,253 | 8/1989 | Buchanan et al. | 437/235 |
| 4,871,692 | 8/1989 | Lee et al. | 148/33.4 |
| 4,935,384 | 6/1990 | Wanlass | 148/DIG. 97 |

FOREIGN PATENT DOCUMENTS

| | | | |
|---|---|---|---|
| 0127200 | 12/1984 | European Pat. Off. . | |
| 0076571 | 6/1981 | Japan | 437/184 |
| 0211974 | 8/1989 | Japan | 437/184 |
| 0211975 | 8/1989 | Japan | 437/184 |
| 0211976 | 8/1989 | Japan | 437/184 |
| 86/02488 | 4/1986 | PCT Int'l Appl. . | |

OTHER PUBLICATIONS

List, R. S. et al., The Si/GaAs(110) Heterojunction, J. Vac. Sci. & Technol. A 4 May/Jun. (1986), No. 3, Part II, Second Series, New York, N.Y. U.S.A.
Woodall, J. M. and Freeouf, J. L., GaAs Metallization: Some Problems and Trends, J. Vac. Sci. Technol., 19(3), Sep./Oct. 1981.
Fountain et al., GaAs MIS Structures with $SiO_2$ Using a Thin Silicon Interlayer, Electronics Letters, vol. 24, No. 18, Sep. 1, 1988.
R. Z. Bachrach et al., Surface Structure and Interface Formation of Si on GaAs (100), J. Vac. Sci. Technol. B 5 94), Jul./Aug. 1987.
J. R. Waldrop et al., Metal Contacts to GaAs with 1 eV Schottky Barrier Height, Appl. Phys. Lett. 52(21), May 23, 1988.

(List continued on next page.)

*Primary Examiner*—Brian E. Hearn
*Assistant Examiner*—Gordon V. Hugo
*Attorney, Agent, or Firm*—Scully, Scott, Murphy & Presser

[57] ABSTRACT

Unpinned epitaxial metal-oxide-compound semiconductor structures are disclosed and a method of fabricating such structures is described. Epitaxial layers of compound semiconductor are grown by MBE which result in the formation of a smooth surface having a stabilized reconstruction. An elemental semiconductor layer is deposited epitaxially in-situ with the compound semiconductor layer which unpins the surface Fermi level. A layer of insulator material is then deposited on the elemental semiconductor layer by PECVD. In one embodiment, the compound semiconductor is GaAs and the elemental semiconductor is Si. The insulator material is a layer of high quality $SiO_2$. A metal gate is deposited on the $SiO_2$ layer to form an MOS device. The epitaxial GaAs layer has a density of states which permits the interface Fermi level to be moved through the entire forbidden energy gap. In another embodiment, the $SiO_2$ deposition completely consumes the interface Si layer so that the resulting MOS device comprises $SiO_2$ directly overlying the GaAs layer.

37 Claims, 3 Drawing Sheets

OTHER PUBLICATIONS

R. W. Grant et al., Variation on n-GaAs (100) Interface Fermi Level by Ge and Si Overlayers, J. Va. Sci. Technol. B 5(4), Jul./Aug. 1987.

Mark E. Greiner et al., Diffusion of Silicon in Gallium Arsenide Using Rapid Thermal Processing: Expreiment and Model, Appl. Phys. Lett. 44(8), Apr. 15, 1984.

S. D. Offsey et al., Unpinned (100) GaAs Surfaces in Air Using Photochemistry, Appl. Phys. Lett. 48(7), Feb. 17, 1986.

C. J. Sandroff et al., Dramatic Enhancement in the Gain of a GaAs/AlGaAs Heterostructure Bipolar Transistor by Surface Chemical Passivation, Appl. Phys. Lett. 51(1), Jul. 6, 1987.

J. Batey et al., Low-Temperature Deposition of High--Quality Silicon Dioxide by Plasma-Enhanced Chemical Vapor Deposition, J. Appl. Phys. 60(9), Nov. 1, 1986.

J. Batey et al., Electrical Characteristics of Very Thin $SiO_2$ Deposited at Low Substrate Temperatures, IEEE Electron Device Letters, vol. EDL-8, No. 4, Apr. 1987.

P. C. Zalm et al., Silicon Molecular Beam Epitaxy Gallium Arsenide, Appl. Phys. Lett. 46(6), Mar. 15, 1985.

G. G. Fountain et al., Electrical and Microstructural Characterization of an Ultrathin Silicon Interlayer used in a Silicon Dioxide/Germanium Based Mis Structure, Proc. Fall Meeting Materials Research Society, Boston, 1987; Elec. Lett. V24 N16, pp. 1010–1011 (1988).

Richard, P. D., J. Vac. Sci. Tech, A3(3), May/Jun. 1985, p. 867.

Li, K., J. Vac. Sci. Tech., A4(3), May/Jun. 1986, p. 958.

Tubib-Azar, M., Appl. Phys. Lett., 52(3), 18, Jan. 1988, p. 206.

METHOD OF MAKING UNPINNED OXIDE-COMPOUND SEMICONDUCTOR STRUCTURES

BACKGROUND OF THE INVENTION

1. Field of the Invention

This invention relates to metal oxide semiconductor (MOS) structures and more particularly to MOS structures on a compound semiconductor, such as GaAs, and to methods of forming a gate insulator, such as $SiO_2$, on a compound semiconductor.

2. Description of the Prior Art

Heretofore, attempts to realize metal-oxide-semiconductor structures on GaAs have been unsuccessful due to the very high density of interface states which are nearly always present at exposed GaAs surfaces or at interfaces with virtually all materials. The presence of the high density of interface states causes the pinning of the GaAs interface Fermi level. The pinning of the interface Fermi level is so tenacious, that it is the basis for reproducible metal-semiconductor GaAs MESFET devices The Fermi level is pinned approximately midgap, i.e. midway between the conduction band energy and the valence band energy at the surface.

It is desirable, however, in many applications to unpin the Fermi level Prior art attempts to unpin the Fermi level at the surface have involved chemical treatments of the GaAs surface. These include the formation of surface Ga oxides by treatment with water and light as described by Offsey, et al. *Appl. Phys. Lett.* 48, 475 (1986) and passivation by a sodium sulfide treatment, as described by Sandroff, et al., *Appl. Phys. Let.* 51, 33 (1987). In addition, it is known that thin overlayers of Ge or Si on GaAs can result in different barrier heights, showing modification of surface Fermi level position, as shown by Grant, et al., *J. Vac. Sci. Tech* B5(4) 1015 (1987). It has not been shown in any prior work, however, that the surface Fermi level position can be moved throughout the forbidden energy gap.

In the fabrication of MOS structures on GaAs, the surface Fermi level should be unpinned to allow the Fermi level to be varied by bias voltages applied to the gate electrode. The movement of the Fermi level permits the device to be operated in an inversion mode or an accumulation mode, depending on the polarity of the bias applied to the gate. In addition, a low leakage gate insulator material is necessary to maximize the gate control of charge carriers.

None of the prior art unpinning techniques have allowed the formation of a low leakage insulating material on the treated surface, without repinning the interfacial Fermi level. MOS capacitor structures with a leaky dielectric generally exhibit poor C-V characteristics, since the channel and metal layers can exchange charge. Even a GaAs surface which is unpinned will not exhibit good charge control by the gate electrode when the insulator is leaky.

SUMMARY OF THE INVENTION

The present invention is directed to oxide-compound semiconductor structures and a method of fabrication which provides a structure having both an unpinned compound semiconductor surface as well as a low leakage gate insulator material. The gate leakage current is minimized by the incorporation of a high quality plasma enhanced chemical vapor deposition (PECVD) oxide. The leakage current and interface state density are low enough to allow the interfacial Fermi level to be swept through the entire semiconductor bandgap, i.e. from accumulation to inversion, corresponding to an unpinned compound semiconductor surface. The present invention may be implemented with compound semiconductors of the III-V system as well as the II-VI system materials. The invention will be described hereinafter by reference to a GaAs compound semiconductor material, however, the invention is not limited to any particular III-V compound material.

Generally, the structure of the invention comprises of a GaAs substrate, various III-V epitaxial layers having a thickness, doping and composition dictated by the particular device for which the structure is designed, an interfacial elemental semiconductor layer and an insulating layer of semiconductor material. A gate metal which is determined by processing issues is disposed on the insulator to form the basic MOS device. The elemental semiconductor material may be selected from a group consisting of silicon and germanium and the insulating layer comprises an oxide of silicon. As with the compound semiconductor, the invention will be described by way of example only, with the interfacial layer being made of elemental silicon and the insulating layer comprising $SiO_2$.

In the method of fabrication, (100) GaAs epitaxial layers are grown under conditions which produce a smooth surface with a stabilized reconstruction. The reconstruction may take many forms such as, for example, a As-stabilized $c(2 \times 8)$ reconstruction. Growth by molecular beam epitaxy (MBE) generally provides smoother and better ordered surfaces than other methods An epitaxial layer of elemental Si is then formed on the epitaxial GaAs. The Si layer is deposited in situ with the GaAs epitaxial layer. Thereafter, a layer of insulator material is deposited on the Si semiconductor layer and a metal gate is deposited on the insulator layer.

The thickness of the Si layer is sufficient to prevent the insulator material from being introduced into the GaAs epitaxial layer to prevent oxidation of the GaAs. After the Si layer is deposited, the structure is removed from the MBE system and then loaded into another system for the deposition of the $SiO_2$. During this time, a very thin native oxide layer is formed on the Si. The $SiO_2$ layer is deposited using a PECVD technique that provides a high quality oxide under low temperatures. The structure is then heat treated and the gate metal is deposited by conventional techniques to form an MOS device. Alternatively, the $SiO_2$ layer may be deposited in situ with the deposit of the GaAs and Si layers by transferring the Si/GaAs structure to an adjacent CVD chamber without breaking vacuum.

The structure of the invention comprises an epitaxially grown compound semiconductor GaAs layer having a density of states which permits the interface Fermi level to be moved through the entire forbidden energy gap in the presence of an electric field. A layer of $SiO_2$ insulator material of low electrical leakage overlies the compound semiconductor material and an epitaxial, single crystal, continuous layer of elemental Si semiconductor is disposed between the compound semiconductor layer and the layer of insulating material. A metal gate is provided on the insulator material to provide a basic MOS device such as a capacitor. Source and drain regions may be formed by conventional ion implantation or other techniques in the compound semiconductor layer and separated by the gate to form a MOSFET.

Thus, the present invention provides a GaAs MOSFET which retains the superior charge control characteristics of the SiO$_2$/Si system as well as the superior transport properties of GaAs.

DETAILED DESCRIPTION OF THE INVENTION

Figure 1:
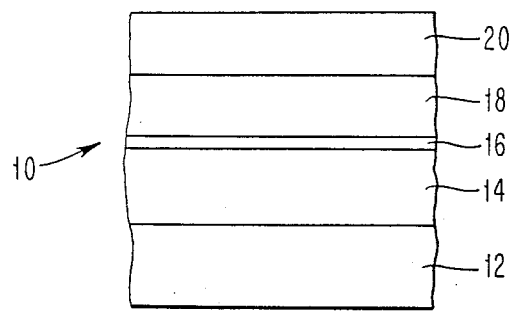
FIG. 1 is a schematic cross-sectional diagram of the GaAs MOS structure of the present invention.

As shown in FIG. 1, the structure 10 of the invention comprises a GaAs substrate 12 upon which a plurality of (100) GaAs epitaxial layers 14 are grown by molecular beam epitaxy under growth conditions which produce a smooth surface, with a surface roughness of three monolayers or less. While the MBE technique is preferred for its ability to provide highly ordered, smooth surfaces, the epitaxial growth may also be performed in a chemical vapor deposition system. The epitaxial growth is typically performed in an ultra high vacuum environment. The growth of the GaAs is terminated under conditions which result in the formation of a stabilized reconstruction at the surface. Typically, GaAs epitaxial growth by MBE results in an As-stabilized c(2×8) reconstruction. Other III-V materials may also result in anion stabilized reconstruction on the surface. For example, in an InP system, a P-stabilized reconstruction will be provided. Metal rich, such as Ga, stabilized reconstructions may also be present. Examples of typical reconstructions are c(4×4), c(2×8), c(8×2), 1×6 and 4×6, which are listed in the order of increasing Ga surface concentration. These reconstructions may be obtained under various conditions as shown, for example, by Bachrach, et al., *J. of Vac. Sci. Tech.* B5(4), 1135 July/August, 1987.

When a As-stabilized c(2×8) reconstruction is provided, the background As vapor is then reduced by shuttering and/or cooling the As source. The substrate is then cooled to a temperature in the range of between 300°-400° C., in such a way as to maintain the As c(2×8) reconstruction. The surface stoichiometry is directly related to the surface reconstruction, and it is expected that the surface stoichiometry will have a profound influence on the electrical properties of the structure.

A Si layer 16 is then deposited onto the clean surface of layers 14 in situ, i.e. in the same ultra high vacuum environment MBE or CVD system used to grow the epitaxial layers 14. The Si layer 16 is deposited at a low rate, for example, approximately 0.1 angstroms per second. The Si layer thickness is determined by several constraints. The minimum thickness is determined by the minimum amount of Si which is necessary to cover and unpin the GaAs surface. In addition, the thickness must be sufficient to prevent the subsequent SiO$_2$ deposition from penetrating and oxidizing the GaAs. The maximum thickness of the Si layer is limited by the thickness which does not allow significant electrical conduction in Si. It is desirable to confine the electrical carriers in a channel in the GaAs layer since the transport properties of GaAs are superior to Si. The Si layer 16 may be between 5 and 100 angstroms thick. Typically, the thickness will be between 10 and 40 angstroms.

Under the deposition conditions described above, the Si adatoms have enough time to allow the formation of an epitaxial layer, without a significant amount of intermixing with the substrate. Reflection electron diffraction patterns observed during the growth of the Si layer indicate that the substrate c(2×8) reconstruction is removed after approximately 5 angstroms of Si have been deposited, and that the Si layer is single crystal. At layer thicknesses in the range of tens of angstroms, it is likely that the Si layer is also pseudomorphic, i.e. is strained to have the same lattice constant as the substrate. The cause of the unpinning of the GaAs surface by the Si is not completely understood. It is believed that the smooth, reconstructed GaAs surface is essential in controlling the Si/GaAs bonding and forming an abrupt low-defect density heterointerface. The GaAs dangling bonds which normally cause Fermi level pinning are satisfied, thereby removing the interface states from the forbidden gap.

After the Si layer 16 is deposited, the structure is removed from the MBE system and then loaded into another system for the deposition of an SiO$_2$ layer 18. During this time, the structure surface is exposed to air. It is expected that the Si surface layer forms a very thin, yet stable oxide and that the Si and native oxide layers form a protective layer on the GaAs surface. The SiO$_2$ layer 18 is preferably deposited by a PECVD technique which produces a high quality oxide utilizing low substrate temperatures during deposition. The SiO$_2$ layer is deposited at a rate of approximately 60 angstroms per minute at a substrate temperature of approximately 350° C., to a thickness of 30 to 500 angstroms. The quality of the PECVD oxide is known to be sensitive to the contamination on the starting substrate surface as well as the surface roughness. Both of these factors are minimized for MBE layers which are grown under UHV conditions and which have extremely smooth surfaces. The preferred PECVD technique is disclosed in more detail in the following articles by Batey et al., both of which are incorporated herein by reference: Low Temperature Deposition of High Quality Silicon Dioxide by Plasma Enhanced Chemical Vapor Deposition, *J. of Appl. Phys.*, 60(9), 3136, Nov. 1, 1986, and Electrical Characteristics of Very Thin SiO$_2$ Deposited at Low Substrate Temperatures, *IEEE Elec. Dev. Lett.*, Vol. EDL-8, No. 4, 148, April, 1987.

In an alternative embodiment, all the layers of the structure are deposited in situ. In this method, the Si/GaAs structure is transferred to a CVD chamber without breaking the vacuum present during deposition of the epilayers. The SiO$_2$ insulator layer is thereafter deposited by a CVD process. In this embodiment, the formation of a native oxide is avoided. The in situ deposition of all the layers is much cleaner as there is no exposure to contaminates present in the ambient.

Figure 2:
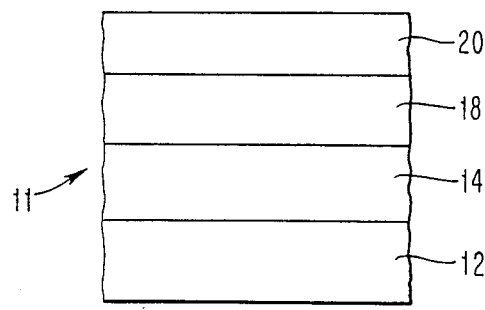
FIG. 2 is a schematic cross-sectional diagram of another embodiment of the GaAs MOS structure of the invention.

In the deposition of the SiO$_2$, at least initially, a certain amount of the oxide penetrates into the elemental silicon layer. As stated above, the thickness of the silicon layer 16 must be sufficient so that the SiO$_2$ deposition does not penetrate and oxidize the epitaxial GaAs layer 14. Typically, the Si layer 16 will be sufficiently thick so that after deposition of the SiO2 layer, a thin layer of Si will remain in the final structure. However, the thickness of the Si layer 16 can be grown so that all of layer 16 is consumed by the SiO2 deposition. Thus, the present invention can provide a final structure having only the SiO2 layer 18 disposed on the GaAs epitaxial layer 14. Heterostructure 11 in FIG. 2 is an example of such a final structure. Hence, in this embodiment, the thin Si layer 16 inhibits oxidation of the GaAs while allowing the full consumption of layer 16 so that the SiO2 insulator layer 18 is in direct contact with the GaAs epitaxial layer 14.

The layers at this point are heated to 400°–750° C. in various inert gas ambients for times in the range of 15 minutes and longer. The gate metal is then deposited by conventional techniques, and the structures are subjected to additional heat treatment. The heat treatments are very similar to that employed in standard silicon MOS technology, as is the photolithographic processing. Heat treatment is necessary to reduce the interface state density.

Figure 3:
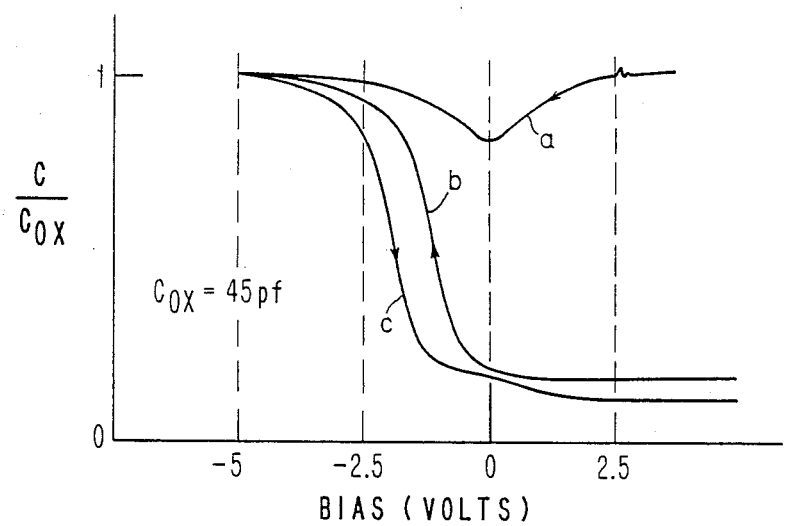
FIGS. 3 and 4 are graphs showing the capacitance versus voltage and the current versus voltage characteristics respectively of a p-type MOS capacitor formed in accordance with the present invention.
Figure 4:
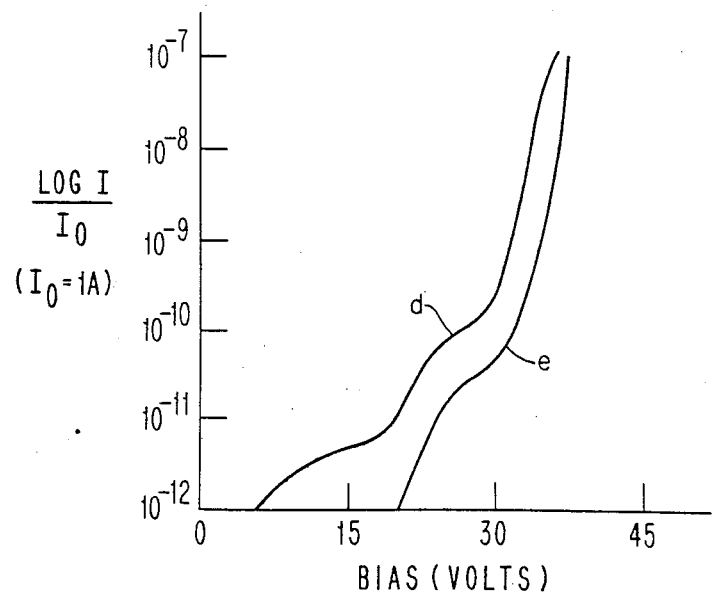

The electrical characteristics of heat-treated MOS capacitors are shown in FIGS. 3 and 4. The capacitance versus voltage (C-V) characteristics shown in FIG. 3 clearly show that an inversion layer can be formed in the epitaxial GaAs layer 14, and that the interfacial Fermi level can be moved through the entire bandgap. The capacitor of FIG. 3 was fabricated with a gate metal comprised of tungsten silicide. The sample was given a pre-deposition anneal of 650° C. in nitrogen for 30 minutes, blanket WSi was deposited, and a subtractive etch was performed to define the gate. A post-metal anneal at 450° C. for 30 minutes in forming gas completed the device. The quasi-static C-V curve a of FIG. 3 was swept at 0.1 V/s and the high-frequency (1 MHz) curves b and c were swept at 0.5 V/s in the directions indicated by the arrows. The gate capacitance in FIG. 3 is normalized for $C_{max}$ which is equal to the oxide capacitance $C_{ox}$, which for this sample is equal to 45 pF. The hysteresis, stretch out, and large difference between the high and low frequency C-V curves indicate both the presence of slow and fast states near the interface. The current versus voltage characteristics shown in FIG. 4 show nearly classic charge injection behavior from the gate metal, which for this sample was Al, into the oxide, and is indicative of a very high quality oxide and metal/oxide interface. Curve d is for a negative bias applied to the gate and curve e is for a positive bias.

Figure 5:
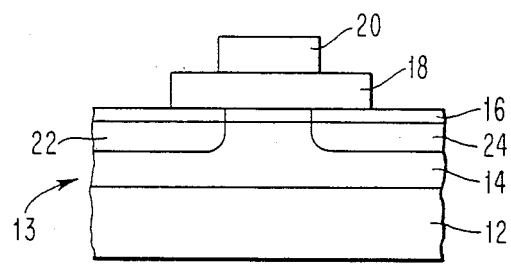
FIG. 5 is a schematic cross-sectional diagram of a MOSFET of the present invention.
Figure 6:
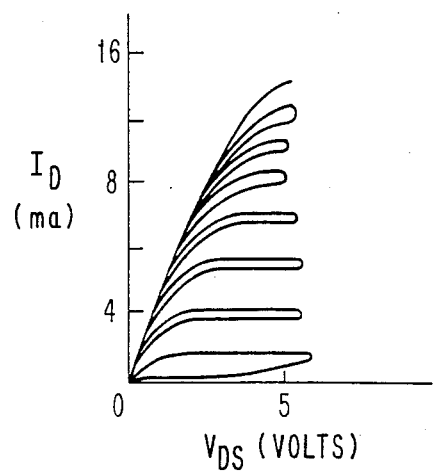
FIG. 6 is a graph showing the source-drain characteristics of a MOSFET of the present invention.

A GaAs MOSFET 13 manufactured in accordance with the invention is shown schematically in FIG. 5. After fabrication of layers 12, 14 and 16 as shown in FIG. 1, the gate and gate insulator regions 20 and 18 are defined by typical processing techniques and source and drain regions 22 and 24 are formed, for example, by ion implantation. The GaAs MOSFET characteristics of $I_D$ versus $V_{DS}$ for $V_G$ applied in one volt steps are shown in FIG. 6, in which the MOSFET was provided with a tungsten silicide gate. The characteristics shown in FIG. 6 are for a device operating in the depletion mode, with a transconductance of 30 mS/mm and a gate length of 8 μm. Transconductances have been obtained up to 60 mS/mm in a device having complete pinch off.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by letters patent is:

1. A method of fabricating a passivated, compound semiconductor structure having a low interface state density comprising the steps of:
   forming a compound semiconductor layer having a highly ordered, smooth surface with a stabilized reconstruction;
   forming on said surface an epitaxial, single crystal, continuous layer of an elemental semiconductor material which unpins said compound semiconductor and having a thickness sufficient to prevent penetration of an insulator material formed in a subsequent step; and
   forming a layer of insulator on said layer of elemental semiconductor material.

2. The method according to claim 1 wherein the surface of the compound semiconductor has an anion stabilized reconstruction.

3. The method according to claim 1 wherein the surface of the compound semiconductor has a metal stabilized reconstruction.

4. The method according to claim 1 wherein the layer of elemental semiconductor formed with a sufficient thickness to space the insulator layer from the interface between the layer of elemental semiconductor and the compound semiconductor layer.

5. The method according to claim 1 wherein all the elemental semiconductor layer is consumed during the formation of the layer of insulator material such that an interface is formed between the layer of insulator and the compound semiconductor.

6. The method according to claim 1 further including the step of providing a conductive element on said insulator layer.

7. The method according to claim 1 wherein the step of forming a compound semiconductor layer includes the step of depositing said compound semiconductor layer on the surface of a compound semiconductor substrate by molecular beam epitaxial deposition.

8. The method according to claim 1 wherein the step of forming a compound semiconductor layer includes the step of depositing said compound semiconductor layer on the surface of a compound semiconductor substrate by chemical vapor deposition.

9. The method according to claim 1 wherein the step of forming an epitaxial layer of an elemental semiconductor includes the step of depositing said layer of an elemental semiconductor by molecular beam epitaxial deposition.

10. The method according to claim 1 wherein the step of forming an epitaxial layer of an elemental semiconductor includes the step of depositing said layer of an elemental semiconductor by chemical vapor deposition.

11. The method according to claim 1 wherein the compound semiconductor layer and the elemental semiconductor layer are formed in situ.

12. The method according to claim 7 wherein the step of forming an epitaxial layer of an elemental semiconductor includes the step of depositing said layer of an elemental semiconductor in situ with the deposition of the compound semiconductor.

13. The method according to claim 12 wherein the compound semiconductor and the elemental semiconductor layers are deposited in an ultra high vacuum environment.

14. The method according to claim 1 wherein said thickness of said insulator layer is in the range of 5-100 angstroms.

15. The method according to claim 1 wherein the step of forming a layer of insulator includes the step of depositing said insulator on said elemental semiconductor layer by plasma enhanced chemical vapor deposition.

16. The method according to claim 1 wherein the step of forming a layer of insulator includes the steps of exposing said elemental semiconductor layer to the ambient to form a thin layer of said insulator on said elemental semiconductor layer, and,
   depositing an additional layer of said insulator on said thin layer of said insulator by plasma enhanced chemical vapor deposition.

17. The method according to claim 1 wherein the step of forming a layer of insulator includes the step of depositing said layer of insulator by chemical vapor deposition.

18. The method according to claim 1 wherein the compound semiconductor, the elemental semiconductor and the insulator layers are formed in situ.

19. The method according to claim 18 wherein the compound semiconductor and the elemental semiconductor layers are formed by molecular beam epitaxy and the insulator layer is formed by chemical vapor deposition.

20. The method of claim 18 wherein the compound semiconductor, the elemental semiconductor and the insulator layers are formed by chemical vapor deposition.

21. The method according to claim 1 wherein said compound semiconductor is a binary, ternary or quaternary compound of elements of Groups III and V of the periodic table of the elements and alloys thereof.

22. The method according to claim 21 wherein said compound semiconductor layer is gallium arsenide.

23. The method according to claim 2 wherein said compound semiconductor layer is gallium arsenide, said anion is arsenic and said reconstruction is $c(2 \times 8)$.

24. The method according to claim 1 wherein said elemental semiconductor material is silicon.

25. The method according to claim 1 wherein said layer of insulator is silicon dioxide.

26. The method according to claim 1 wherein said compound semiconductor layer has a (100) crystallographic orientation.

27. A method of fabricating a compound semiconductor structure having a low interface state density comprising the steps of:
   epitaxially growing a layer of GaAs having a highly ordered, smooth surface with a stabilized reconstruction;
   epitaxially growing on said surface an epitaxial, single crystal, continuous layer of Si which unpins said GaAs surface; and
   depositing a layer of $SiO_2$ on said Si layer.

28. The method according to claim 27 wherein the surface of the GaAs has an As-stabilized $c(2 \times 8)$ reconstruction.

29. The method according to claim 28 wherein the layer of Si is grown with a sufficient thickness to space the $SiO_2$ layer from the interface between the Si layer and the GaAs layer.

30. The method according to claim 28 wherein the layer of Si is grown with a sufficient thickness so that all the Si layer is consumed during the deposition of the $SiO_2$ layer such that an interface is formed between the $SiO_2$ layer and the GaAs layer.

31. The method according to claim 28 further including the step of providing a conductive element on said $SiO_2$ layer.

32. The method according to claim 31 wherein the GaAs layer is grown on the surface of a GaAs substrate by molecular beam epitaxial deposition.

33. The method according to claim 32 wherein the Si layer is grown by molecular beam epitaxial deposition in situ with the growth of the GaAs layer.

34. The method according to claim 33 wherein the GaAs and the Si layers are deposited in an ultra high vacuum environment.

35. The method according to claim 34 wherein the thickness of said Si layer is in the range of 5-100 angstroms.

36. A method according to claim 35 wherein the $SiO_2$ layer is deposited by plasma enhanced chemical vapor deposition.

37. The method according to claim 36 further including the step of exposing said Si layer to the ambient to form a thin layer of said insulator on said Si layer, prior to deposition of the $SiO_2$ layer.

* * * * *